(12) United States Patent
Schluchter et al.

(10) Patent No.: US 7,545,507 B2
(45) Date of Patent: Jun. 9, 2009

(54) DISPLACEMENT MEASUREMENT SYSTEM

(75) Inventors: William Clay Schluchter, Los Altos, CA (US); Miao Zhu, San Jose, CA (US); Geraint Owen, Palo Alto, CA (US); Alan B. Ray, Palo Alto, CA (US); Carol J. Courville, San Jose, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 110 days.

(21) Appl. No.: 11/686,855

(22) Filed: Mar. 15, 2007

(65) Prior Publication Data
US 2008/0225262 A1 Sep. 18, 2008

(51) Int. Cl.
*G01B 11/02* (2006.01)
(52) U.S. Cl. ...................................................... 356/499
(58) Field of Classification Search ................. 356/488, 356/494, 499, 521
See application file for complete search history.

(56) References Cited

U.S. PATENT DOCUMENTS

| 4,772,119 | A | * | 9/1988 | Bouwhuis et al. | ........... 356/124 |
| 4,979,826 | A | * | 12/1990 | Ishizuka et al. | ............. 356/499 |
| 5,661,296 | A | * | 8/1997 | Ishizuka et al. | ........ 250/231.14 |
| 2002/0085210 | A1 | * | 7/2002 | Takayama et al. | ........... 356/499 |
| 2007/0058173 | A1 | * | 3/2007 | Holzapfel | ................... 356/499 |

* cited by examiner

*Primary Examiner*—Michael A Lyons
(74) *Attorney, Agent, or Firm*—June L. Bouscaren

(57) ABSTRACT

A displacement measurement apparatus includes a light source, a splitter grating, a measurement grating, and first a second detector arrays. The splitter grating splits a light beam into first and second measurement channels that each illuminates the measurement grating. The first and second measurement channels split into $0^{th}$ and $1^{st}$ order diffraction products at the measurement grating in a first pass and recombine at the measurement grating in a second pass before being measured at the first and second detector arrays.

27 Claims, 6 Drawing Sheets

DISPLACEMENT MEASUREMENT SYSTEM

BACKGROUND

Use of laser interferometry is known for precise measurement of small displacements and rotations using a beam of light split into reference and measurement beams. The measurement beam is reflected from a mirror mounted on a moving object and is combined with the reference beam reflected from a stationary object to generate a phase difference. The phase difference is proportional to the amount of displacement made between the reflector of the reference beam and the reflector of the measurement beam.

In many applications, the measurement beam path passes through air. In some applications, a double pass beam path can permit cancellation of propagation angles between the measurement beam path and the reference beam path. The double pass beam path increases the beam path length. Furthermore, the optical path length of the light can be more than four times the stroke of the moving object. In wafer exposure tools used in integrated circuit lithography, the optical path length can approach two meters. The long beam path presents a challenge for the measurement because the air through which the light travels must be well controlled in terms of temperature, pressure and gas composition. Because temperature, pressure and gas composition all affect a refractive index of air, a change or inconsistency in any of them, presents as a phase shift and therefore a measurement error or measurement uncertainty. In many applications, the control of the index of refraction of air is becoming a performance limiting factor.

It is desirable, therefore, to reduce a path length of light travel in interferometry displacement measurement applications.

BRIEF DESCRIPTION OF THE DRAWINGS

An understanding of the present teachings can be gained from the following detailed description, taken in conjunction with the accompanying drawings of which like reference numerals in different drawings refer to the same or similar elements.

DETAILED DESCRIPTION

In the following detailed description, for purposes of explanation and not limitation, example embodiments disclosing specific details are set forth in order to provide an understanding of embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatus and methods may be omitted so as to not obscure the description of the example embodiments. Such methods and apparatus are clearly within the scope of the present teachings.

Figure 1:
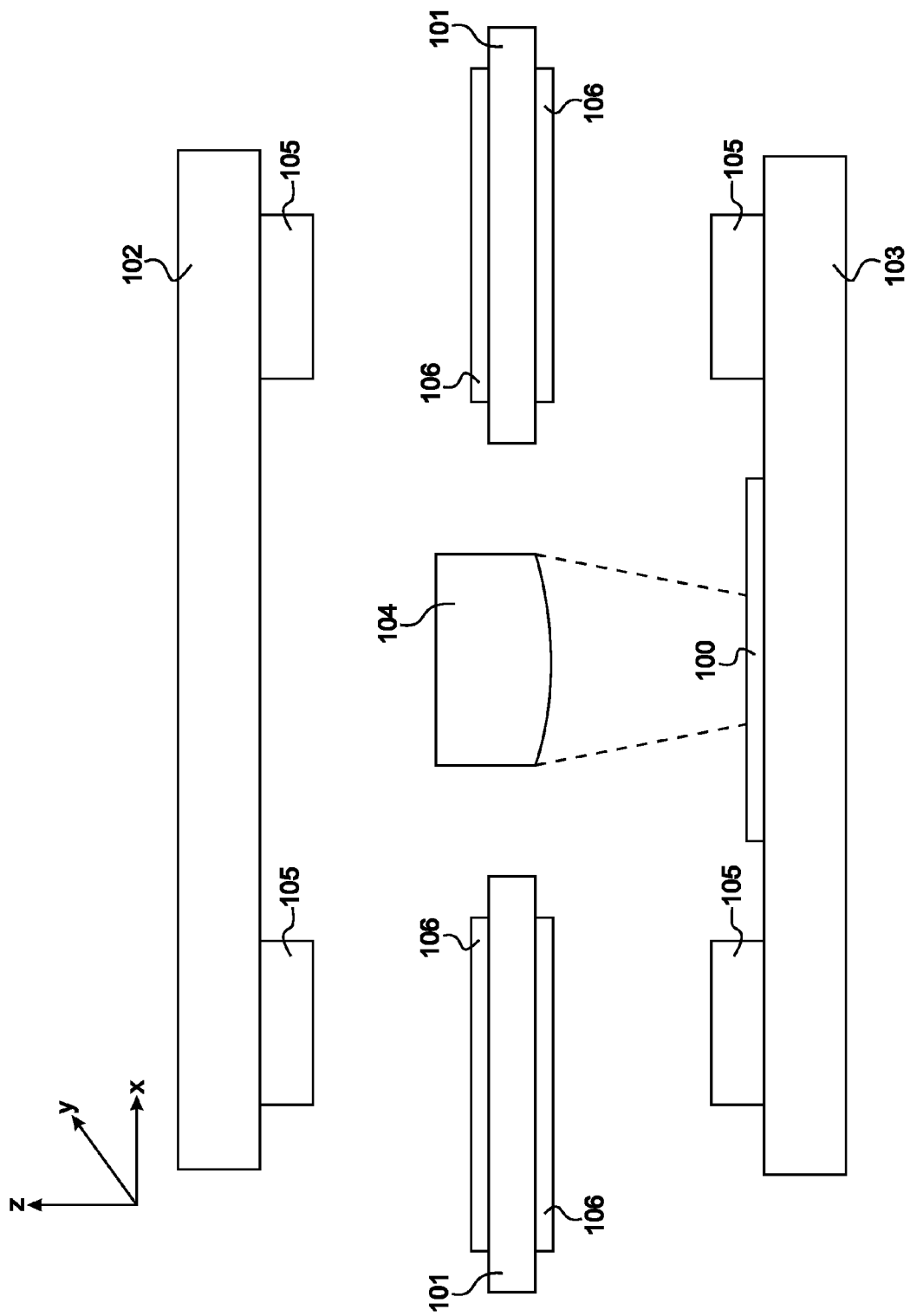
FIG. 1 is a block diagram of a photolithography application embodiment appropriate for use with a specific embodiment according to the present teachings.

With specific reference to FIG. 1 of the drawings, there is shown a side view of a portion of a photolithography system used as part of a process for manufacture of a semiconductor wafer 100. The photolithography system includes a stationary reference frame 101, a mask stage 102, a wafer stage 103, and projection lens 104. The photolithography system benefits from inclusion of one or more sensor heads 105 and measurement gratings 106 as elements of a displacement measurement apparatus according to the present teachings. FIG. 1 shows the sensor head 105 affixed to the moving stage 102, 103 and the measurement grating 106 affixed to the stationary reference frame 101. As one of ordinary skill in the art appreciates, it is equally appropriate to affix the sensor head 105 to the stationary reference frame 101 and the measurement grating 106 to the moving stage 102, 103.

Figure 2:
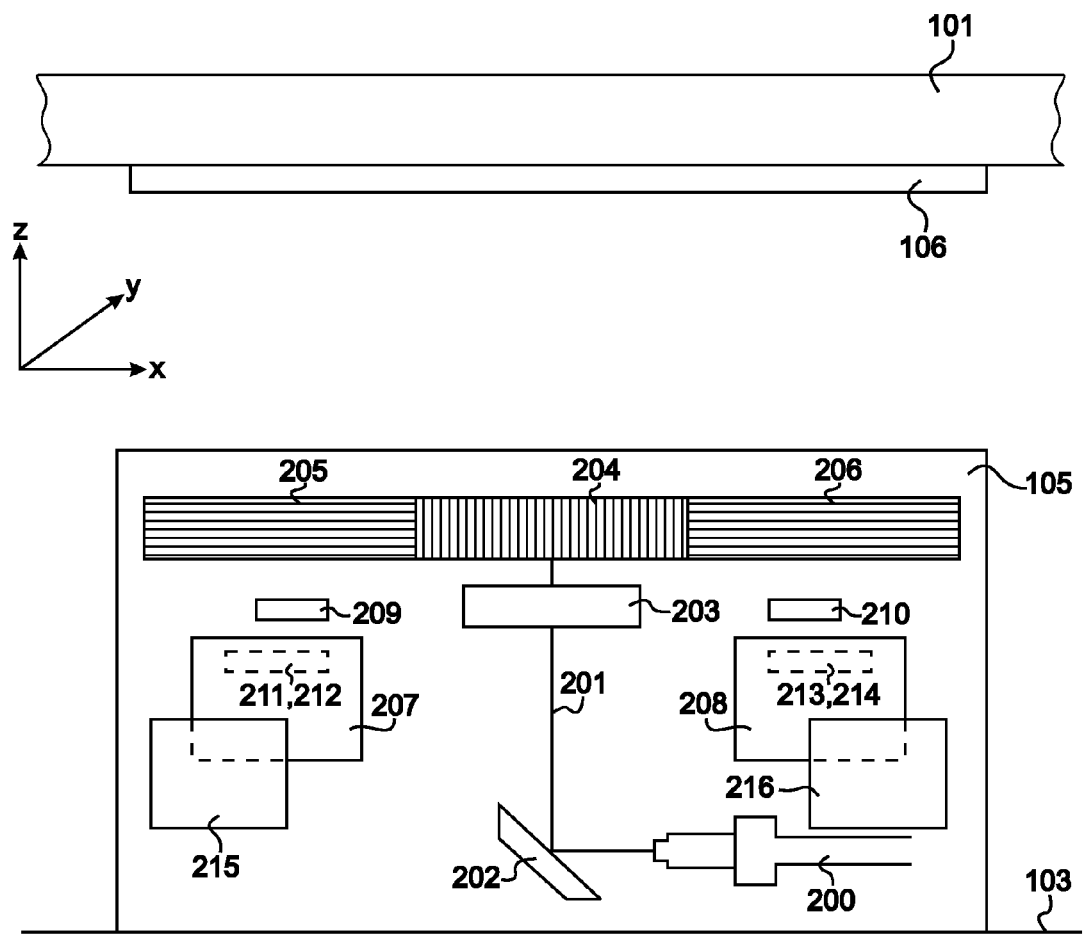
FIG. 2 is a block diagram of a specific embodiment of a sensor head in the x-z plane that is part of the distance measurement system according to the present teachings.

With specific reference to FIG. 2 of the drawings, there is shown a more detailed side view of a specific embodiment of the sensor head 105 and the measurement grating 106 according to the present teachings shown in an x-z plane. The sensor head 105 includes a light source or delivery fiber 200 that provides a light beam 201 having one optical frequency. The light beam 201 is shown as reflected from a mirror 202 before impinging on splitter grating 204. In the specific embodiment, the reflection from the mirror is an artifact from the desire to fit the light source 200 in a horizontal orientation. One of ordinary skill in the art appreciates, however, that a vertical orientation of the light source 200 is also appropriate and that the vertical orientation may not call for the mirror 202 to further direct the light. A Lens, such as collimator 203, is disposed between the mirror 202 or light source 200 and the splitter grating 204 to collimate the light beam as appropriate before it illuminates the splitter grating 204. One of ordinary skill in the art appreciates that the lens or collimator 203 is not required if the light beam is already sufficiently focused for purposes of the specific application. In another embodiment, a single optical element, such as a Fresnel Lens, may be used to both split and focus the light beam instead of using separate splitter 204 and collimator 203 elements. First and second multiplexing gratings 205, 206 are on opposite ends of the splitter grating 204. In a specific embodiment, the splitter grating 204 is contiguous with the two multiplexer gratings 205, 206 and has a substantially similar pitch. Also in a specific embodiment, the splitter grating 204 is defined by a groove orientation that is perpendicular to the groove orientation of the multiplexer gratings 205, 206. In a specific embodiment, each of the multiplexer gratings 205, 206 has similar groove orientations. The sensor head 105 further includes first and second retroreflectors 207, 208, first and second focusing lenses 209, 210, first, second, third and fourth polarizer/retarders 211, 212, 213, 214 and first and second detector arrays 215, 216. In an alternative embodiment, the functions provided by the multiplexer gratings 205, 206 and focusing lenses 209, 210 may be incorporated into a single optical element. The retroreflectors 207, 208 reflect light antiparallel to the impinging light and in a specific embodiment, may be either cube corners, cat's eyes, or other type of known retroreflector. The term "antiparallel" as used herein refers to the condition of light beams being parallel and propagating in opposite directions. Each retroreflector 207, 208, lens 209, 210, and detector array 215, 216 is associated with respective multiplexer gratings 205, 206 and in a specific embodiment there are two polarizer/retarders 211, 212 and 213, 214 associated with each multiplexer grating 205, 206.

Figure 3:
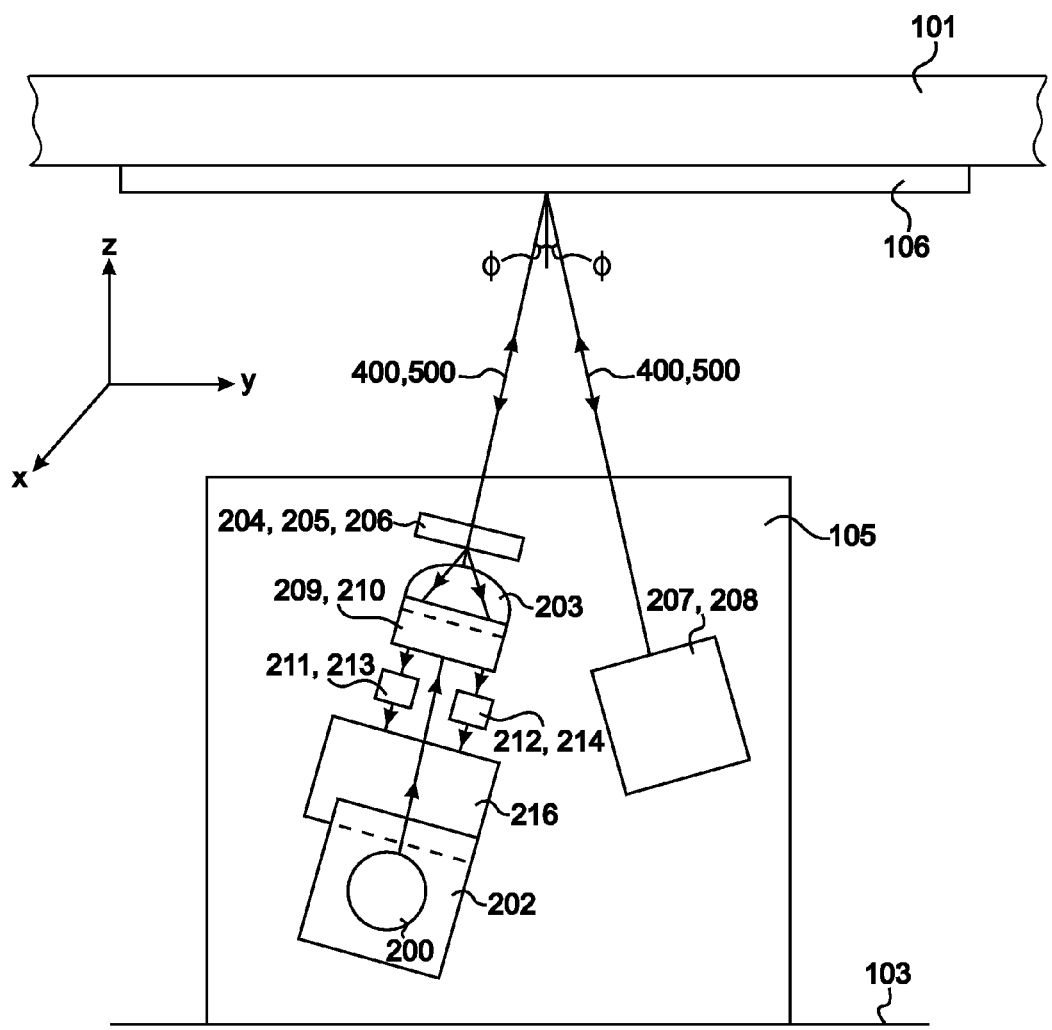
FIG. 3 is a block diagram of the specific embodiment of FIG. 2 in the y-z plane and showing a beam path.

With specific reference to FIG. 3 of the drawings, there is shown a side view of the sensor head 105 and the measurement grating 106 according to the present teachings shown in the y-z plane. The mirror 202, collimator 203, and splitter grating 204 are disposed somewhat central to the x-z plane of the sensor head 105 and aligned with each other. The first and second multiplexer gratings 205, 206 are contiguous with and disposed on either side of the splitter grating 204. On either side of the sensor head 105, respective ones of the lenses 210, 209, the polarizer/retarder pairs 213, 214 and 211, 212, and the detector arrays 216, 215 are generally aligned and slightly canted relative to the horizontal defined by the stage 103 or 102 to which the sensor head is affixed. The retroreflectors 208, 207 are separated from the other components in the y-direction and are also slightly canted relative to the horizontal defined by the stage 103 or 102 to which the sensor head is affixed. The retroreflectors 208, 207 are aligned along the x-axis as shown in FIGS. 2 and 3. Similarly, the lenses 210, 209, polarizer/retarder pairs 213, 214 and detector arrays 216, 215 are aligned along the x-axis.

The light source 200 and mirror 202 are spatially arranged and configured to cause a light beam 201 to impinge splitter grating 204 at a perpendicular in the x-z plane. The splitter grating 204 divides the light beam 201 and forms two separate measurement channel light beams at angle $\alpha$ relative to the impingement angle. The two separate light beams that emerge from the splitter grating 204 are herein referred to as first and second measurement channels 400 and 500.

Figure 4:
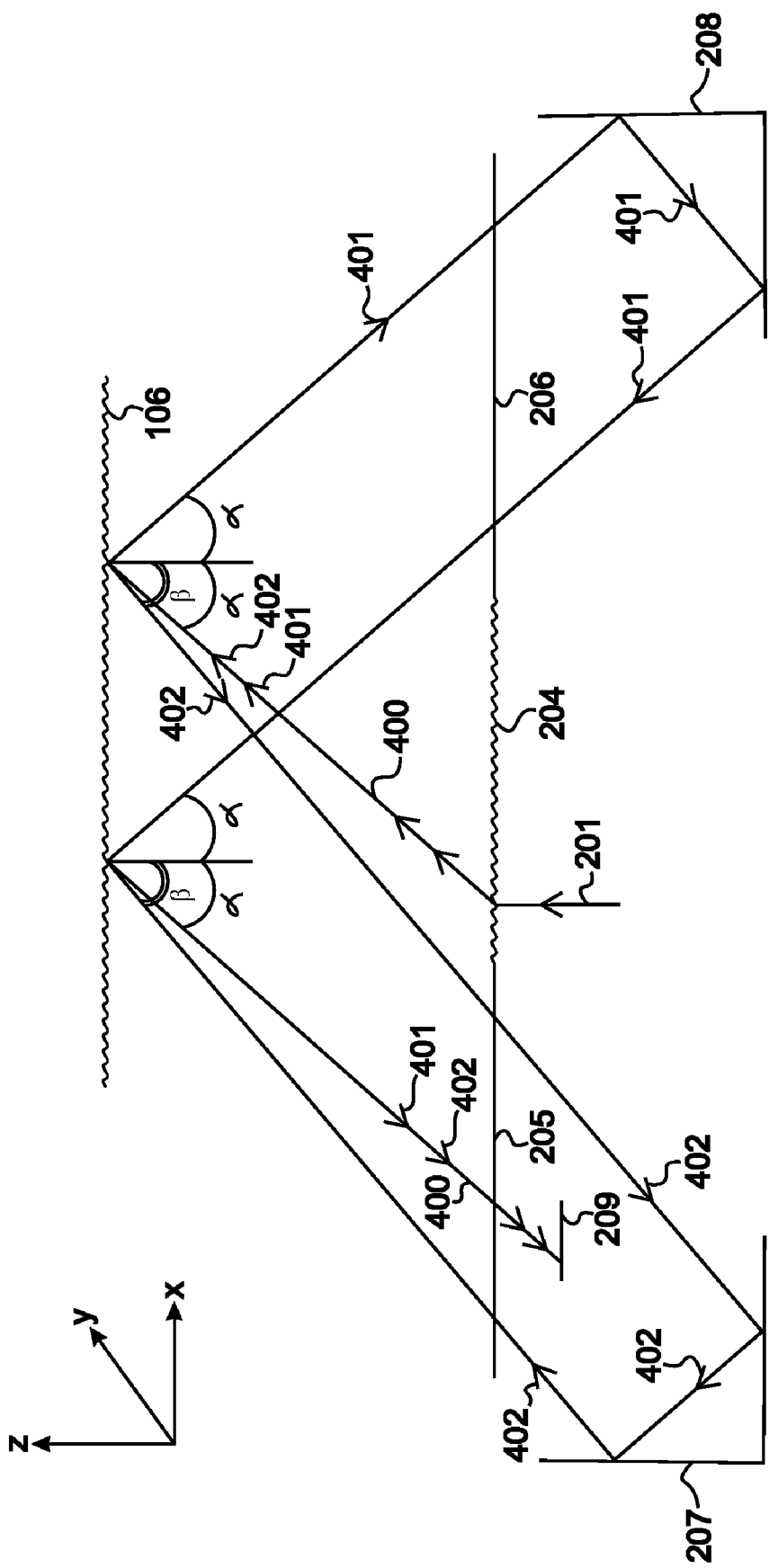
FIG. 4 is a diagram of a first measurement channel path in a specific embodiment according to the present teachings.

With specific reference to FIG. 4 of the drawings, there is shown a representative diagram of a portion of the beam path of the first measurement channel 400 between the splitter grating 204 and the measurement grating 106. The first measurement channel 400 exits the splitter grating 204 and impinges the measurement grating 106 at angle $\alpha$. Angle $\alpha$ is defined as the arctangent of the ratio of the x-component to the z-component of the impinging beam 400. The measurement grating 106 is a reflection phase grating configured to diffract the light into multiple orders. First arm 401 of the first measurement channel 400 is the $0^{th}$ order diffraction (also termed a reflection path) and reflects from the measurement grating 106 at angle $\alpha$. The first arm 401 of the first measurement beam 400 passes behind the multiplexer grating 206 to impinge second retroreflector 208. The second retroreflector 208 reflects the first arm 401 of first measurement beam 401 anti-parallel and spatially separated. The reflected first arm 401 passes behind the multiplexer grating 206 to impinge the measurement grating 106 also at angle $\alpha$. The first arm 401 reflects from the measurement grating 106 a second time and once again at angle $\alpha$ to impinge the first multiplexer 205.

The second arm 402 of the first measurement channel 400 is the $1^{st}$ order diffraction and also impinges the measurement grating at angle $\alpha$ and then diffracts at angle $\beta$ according to the Grating Law and defined by the characteristics of the measurement grating 106. Angle $\beta$ is defined as the arctangent of the ratio of the x-component to the z-component of the diffracted beam. The second arm 402 passes behind the multiplexer grating 205 to impinge the first retroreflector 207. The first retroreflector 207 reflects the second arm 402 anti-parallel to the incident beam. The second arm 402 passes behind the first multiplexer grating 205 to impinge the measurement grating 106 at angle $\beta$. The second arm 402 diffracts from the measurement grating 106 at angle $\alpha$ to re-combine and become co-linear with the first arm 401 before impinging first multiplexer grating 206 recombined as measurement channel 400.

In an alternative embodiment, the light beam follows a similar path to that described with respect to FIG. 4, except that the measurement grating 106 diffracts the impinging light beam so that angle $\alpha$ is equal to the angle $\beta$. This alternative embodiment is not sensitive to changes in displacement in the z direction.

Figure 5:
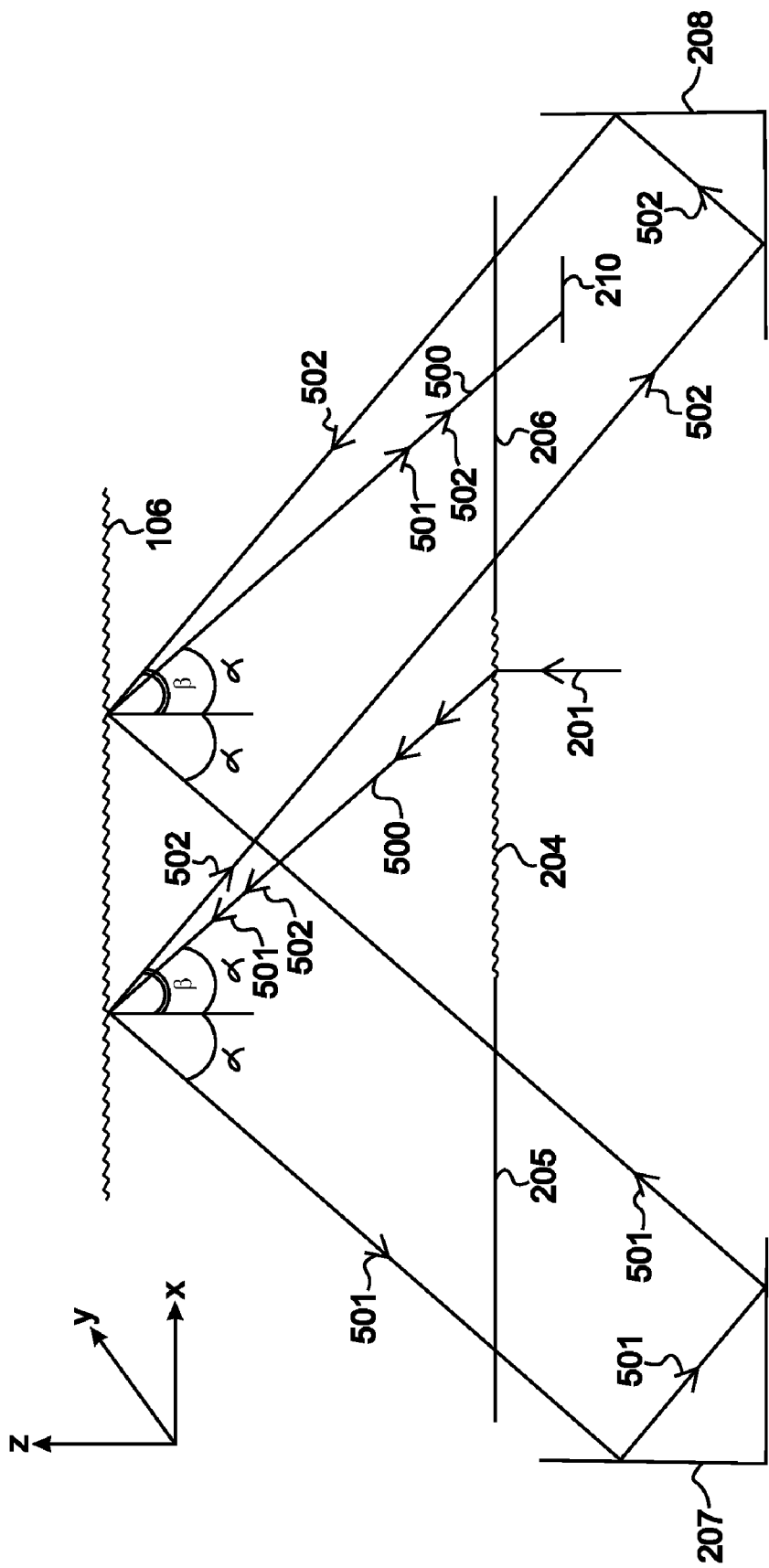
FIG. 5 is a diagram of a second measurement channel path in a specific embodiment according to the present teachings.

With specific reference to FIG. 5 of the drawings, there is shown a representative diagram of the beam path of the second measurement channel 500 between the splitter grating 204 and the measurement grating 106. The second measurement channel 500 exits the splitter grating 204 in a direction having an x vector component in an opposite direction from the first measurement channel 400 as illustrated and impinges the measurement grating 106 at angle $\alpha$. First arm 501 is the $0^{th}$ order diffraction (also referred to as the reflection path) and reflects from the measurement grating 106 at angle $\alpha$. The first arm 501 of the second measurement channel 500 passes behind the first multiplexer grating 205 to impinge the first retroreflector 207. The first retroreflector 207 reflects the first arm 501 of second measurement channel 500 anti-parallel and spatially separated. The reflected anti-parallel first arm 501 passes behind the multiplexer grating 205 to impinge the measurement grating 106 also at angle $\alpha$. The first arm 501 reflects from the measurement grating 106 a second time once again at angle $\alpha$ and impinges the second multiplexer grating 206.

Second arm 502 of the second measurement channel 500 is the $1^{st}$ order diffraction diffracts at angle $\beta$. The second arm 502 passes behind the splitter grating 204 to impinge the second retroreflector 208. The second retroreflector 208 reflects the second arm 502 anti-parallel to the incident beam. The second arm 502 passes behind the second multiplexer grating 206 to impinge the measurement grating 106 at angle $\beta$. The second arm 502 diffracts from the measurement grating 106 at angle $\alpha$ to recombine and become co-linear with the first arm 501 before impinging the second multiplexer grating 206.

With specific reference to FIG. 3 of the drawings, there is shown a side view representation of the sensor head and the beam path of the first and second measurement channels 400, 500 in the y-z plane. Both arms 401, 402 and 501, 502 of both measurement channels 400, 500 align in the y-z plane. In a specific embodiment, the reflected and diffracted beams are incident to the measurement grating 106 at angle $\phi$ in the y-z plane and reflect/diffract at angle $\phi$ in the y-z plane. Reflection and diffraction in the x-z plane is as described with respect to FIG. 4. Altering the angle $\phi$ in the y-z plane does not change the definitions of the angles $\alpha$ and $\beta$ in the x-z plane.

Figure 6:
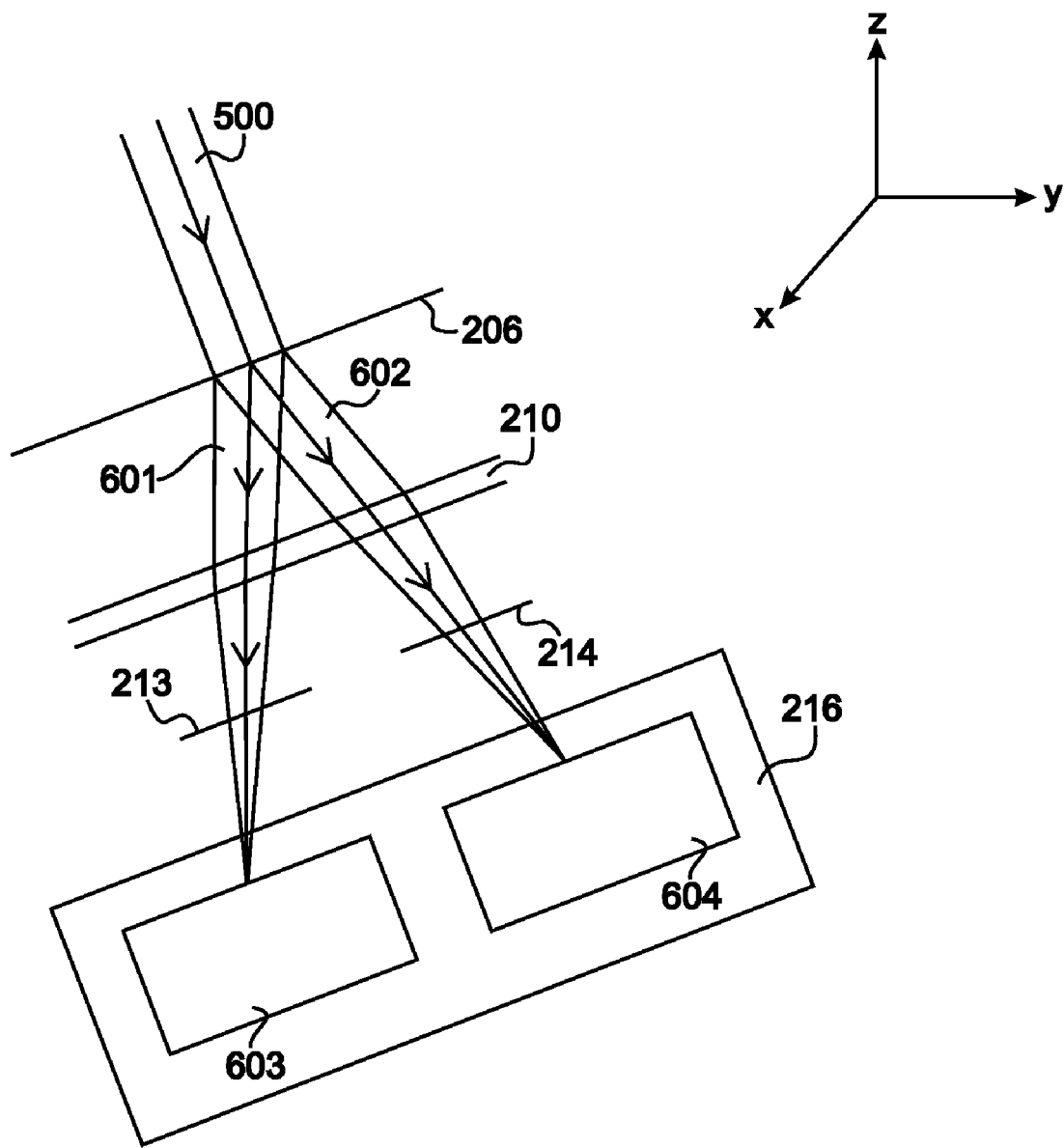
FIG. 6 is a more detailed view of a portion the beam path in a specific embodiment according to the present teachings.

With specific reference to FIG. 6 of the drawings, there is shown a more detailed illustration of a beam path of the second measurement channel 500 in the y-z plane after the second measurement channel impinges the multiplexer grating 206. The first measurement channel 400 follows a similar beam path through respective elements associated with it. Accordingly, one of ordinary skill in the art is able to reproduce the beam path for the first channel 400 given benefit of the beam path for the second channel 500. The second measurement channel 500 impinges the second multiplexer grating 206. The second multiplexer grating 206 splits the light into first and second detector beams 601, 602 that emerge from the multiplexer grating 206 in the y-z plane. In certain cases, it is beneficial to use a relatively large diameter beam to obtain a larger operational range of stage translation and rotation and to average out spatial frequency errors in the measurement grating 106. A pitch of the multiplexer gratings 205, 206 is chosen for convenience and depends upon a desired angle of split. A larger beam diameter calls for a larger split angle for the same amount of distance between the multiplexer and the next element the beam impinges. If a large diameter beam is used, each detector beam 601, 602 may optionally be focused by lens 210. Each focused beam 601, 602 then passes through respective first and second polarizer/retarders 213, 214 that provide a constant phase offset. In a specific embodiment, the constant phase offset can be substantially 90 degrees between the first and second detector beams 601, 602 before impinging detector array 216.

In a specific homodyne embodiment, the detector array 216 comprises first and second detector elements 603, 604 for each beam detected. Each detector beam 601, 602 has a dynamic phase difference, or a phase difference that changes with position of the measurement grating 106 relative to the sensor head 105. The dynamic phase difference is common to all signals from one multiplexer. Each detector beam 601, 602 also has a constant phase difference which is independent of every other signal from one multiplexer. Homodyne systems benefit from at least two detector beams in order to maintain directional sense of the change in position. A larger number of detectors may be appropriate for alternative embodiments in which case the polarizer/retarders for each beam will have a constant phase difference that is appropriate for the number of detectors. In the case of N detectors, where N>2, the phase difference between the adjacent detectors could be equal to 360/N degrees. In a heterodyne embodiment, there may be a single detector element in the detector array 215 or 216.

Electronics connected to the sensor heads 105 extract the dynamic portion of the phase difference measured at each detector array 215 or 216. Because there are two measurement channels 400, 500, there are two phase differences to be measured for each sensor head 105. The two phase differences are expressed as $N_A$ and $N_B$, where $N_A$ and $N_B$ are in units of waves. The position of the sensor head 105 with respect to the measurement grating 106 is given by the following equations:

$$x = \frac{p}{4}(N_B - N_A)$$

$$z = \frac{p}{4}(N_B + N_A)\cot\frac{1}{2}(\beta - \alpha)$$

Where p is the measurement grating pitch, $\alpha$ is the angle between the beam from the splitter grating and the measurement grating normal, and $\beta$ is the angle between the diffraction path and the measurement grating normal.

Precision position measurement of a stage with Abbe error compensation optimally makes a measurement of at least six degrees of freedom, translation along the X, Y and Z axes as well as rotations about the X, Y and Z axes. The sensor head 105 according to the present teachings may be used to measure two degrees of freedom, specifically translation along the X and Z axes. In another embodiment according to the present teachings that also measures rotation about the Y and Z axes, a second sensor head is placed in a separate location so that a separate light beam impinges either the same measurement grating 106 as the first sensor head or a second independent measurement grating having a pitch aligned along a same axis. For example, if the light beam from the first sensor head 105 impinges the measurement grating 106 having a pitch aligned along the X axis, the second sensor head generates a light beam that impinges the same measurement grating 106 or a separate measurement grating having a pitch aligned along the X axis. A location of the second sensor head may be chosen such that measurements from the first and second sensor head can be combined to measure translations in X and Z directions along with rotations about Y and Z directions. A third sensor head can deliver the remaining Y direction translation and rotation about the X axis if the third sensor head is rotated approximately 90 degrees about the Z axis with respect to the first two sensor heads and impinges a measurement grating with a pitch along the Y axis. This y direction measurement grating may be a separate optic from the measurement grating(s) impinged by the first two sensor heads, or it may be the same grating that not only has a pitch along the X axis but also a pitch along the Y axis. In this configuration, all sensor heads operate similarly and measure light beams that are diffracted from the grating pitch parallel to the direction of motion. In yet another embodiment, the measurement gratings have pitches along non orthogonal directions.

Embodiments of the teachings are described herein by way of example with reference to the accompanying drawings describing a displacement measurement apparatus. Other variations, adaptations, and embodiments of the present teachings will occur to those of ordinary skill in the art given benefit of the present teachings.

The invention claimed is:

1. An apparatus comprising:
   a sensor head and a measurement grating, the sensor head configured to provide a light beam,
   a splitter grating that splits the light beam into first and second measurement channels,
   a first retroreflector configured to retroreflect the first and second measurement channels back to the measurement grating,
   a second retroreflector configured to retroreflect the first and second measurement channels back to the measurement grating,
   a first detector array disposed to receive the first measurement channel, and
   a second detector array disposed to receive the second measurement channel,
   wherein the measurement grating is configured to split each measurement channel into first and second arms in a first pass of illumination and recombine the first and second arms in a second pass of illumination.

2. An apparatus as recited in claim 1 wherein the sensor head is a first sensor head positioned to measure displacement along a first axis and further comprising a second sensor head positioned to measure displacement along an axis orthogonal to the first axis.

3. An apparatus as recited in claim 2 wherein the first and second sensor head impinge the measurement grating.

4. An apparatus as recited in claim 2 wherein the measurement grating has a pitch aligned along two orthogonal axes.

5. An apparatus as recited in claim 2 wherein the measurement grating is a first measurement grating and the first sensor head impinges the first measurement grating and the second sensor head impinges a second measurement grating.

6. An apparatus as recited in claim 1 wherein the first arm reflects from the measurement grating at angle $\alpha$ and the second arm diffracts from the measurement grating at angle $\beta$.

7. An apparatus as recited in claim 6 wherein the angle $\alpha$ is not equal to the angle $\beta$.

8. An apparatus as recited in claim 6 wherein the angle $\alpha$ is substantially equal to the angle $\beta$.

9. An apparatus as recited in claim 1 wherein the light beam has one optical frequency.

10. An apparatus as recited in claim 1 wherein the light beam has two optical frequency components.

11. An apparatus as recited in claim 10 wherein the light beam has two optical frequency components isolated by polarization.

12. An apparatus as recited in claim 1 and further comprising a collimator disposed between the source and the splitter grating.

13. An apparatus as recited in claim 1 wherein the splitter grating has a splitting portion and first and second multiplexing portions.

14. An apparatus as recited in claim 1 wherein first and second lenses are disposed between the splitter grating and the respective first and second detector arrays.

15. An apparatus as recited in claim 1 wherein the retroreflectors are cube corners.

16. An apparatus as recited in claim 1 wherein the splitter grating is contiguous with the multiplexer gratings.

17. An apparatus as recited in claim 1 wherein the measurement grating is affixed to an object in motion and the sensor head is stationary.

18. An apparatus as recited in claim 1 wherein the sensor head is affixed to an object in motion and the measurement grating is stationary.

19. An apparatus as recited in claim 1 wherein the sensor head and measurement grating are affixed to respective objects in motion.

20. An apparatus as recited in claim 1 wherein the x-direction is in the plane of the measurement grating and perpendicular to the grating grooves and the z-direction is perpendicular to the measurement grating wherein displacement in the x direction is proportional to the difference between a phase difference detected from the first measurement channel and a phase difference detected from the second measurement channel and wherein displacement in the z direction is proportional to the sum of a phase difference detected from a first measurement channel and a phase difference detected from a second measurement channel.

21. An apparatus as recited in claim 20 wherein the detector arrays measure a phase difference for the first and second measurement channels represented as $N_A$ and $N_B$ wherein x-displacement is calculated as:

$$x = \frac{p}{4}(N_B - N_A)$$

And z-displacement is calculated:

$$z = \frac{p}{4}(N_B + N_A)\cot\frac{1}{2}(\beta - \alpha)$$

wherein p is a pitch of the measurement grating, $\alpha$ is the angle of impingement of the measurement channel to the measurement grating relative to the normal of the measurement grating, and $\beta$ is an angle of diffraction of the second arm relative to the normal of the measurement grating.

22. A method of measuring displacement comprising:

splitting a light beam into first and second measurement channels at a splitter grating, illuminating a measurement grating with the first and second measurement channels to create first and second arms for each measurement channel, reflecting each arm back to the measurement grating to recombine the respective first and second arms of each measurement channel, detecting a phase difference of each measurement channel, and calculating a displacement between the measurement grating and the splitter grating wherein displacement along an x-axis and a displacement along a z-axis is calculated from the first and second measurement channels wherein the x-axis is in the plane of the measurement grating and the z-axis is perpendicular to the plane of the measurement grating.

23. A method as recited in claim 22 wherein the light beam has one optical frequency.

24. A method as recited in claim 22 wherein the light beam has two frequency components isolated by polarization.

25. A method as recited in claim 22 and further comprising sourcing the light beam from a sensor head and affixing the sensor head to a stationary object and affixing the measurement grating to a moving object.

26. A method as recited in claim 22 and further comprising sourcing the light beam from a sensor head and affixing the sensor head to a moving object and affixing the measurement grating to a stationary object.

27. A method as recited in claim 22 and further comprising sourcing the light beam from a sensor head and affixing the sensor head and the measurement grating to respective moving objects.

* * * * *